United States Patent
Yin et al.

(10) Patent No.: US 12,328,952 B2
(45) Date of Patent: Jun. 10, 2025

(54) LARGE CELL SHEETS, SOLAR CELLS, SHINGLED SOLAR MODULE, AND MANUFACTURING METHOD THEREOF

(71) Applicant: TONGWEI SOLAR (HEFEI) CO., LTD, Anhui (CN)

(72) Inventors: Bingwei Yin, Hefei (CN); Jun Sun, Hefei (CN); Dengyun Chen, Hefei (CN); Yan Li, Hefei (CN); Gang Shi, Hefei (CN)

(73) Assignee: TONGWEI SOLAR (HEFEI) CO., LTD. (CN)

( * ) Notice: Subject to any disclaimer, the term of this patent is extended or adjusted under 35 U.S.C. 154(b) by 120 days.

(21) Appl. No.: 17/915,633

(22) PCT Filed: Sep. 27, 2020

(86) PCT No.: PCT/CN2020/118186
§ 371 (c)(1),
(2) Date: Sep. 29, 2022

(87) PCT Pub. No.: WO2021/013276
PCT Pub. Date: Jan. 28, 2021

(65) Prior Publication Data
US 2023/0097957 A1 Mar. 30, 2023

(30) Foreign Application Priority Data
Mar. 30, 2020 (CN) .......................... 202010237613.2

(51) Int. Cl.
*H10F 19/90* (2025.01)
*H10F 10/14* (2025.01)
(Continued)

(52) U.S. Cl.
CPC ............ *H10F 19/904* (2025.01); *H10F 10/14* (2025.01); *H10F 71/103* (2025.01); *H10F 71/137* (2025.01); *H10F 77/1662* (2025.01)

(58) Field of Classification Search
None
See application file for complete search history.

(56) References Cited

U.S. PATENT DOCUMENTS

| 2017/0301801 A1* | 10/2017 | Nguyen | .......... H01L 31/022433 |
| 2018/0198008 A1* | 7/2018 | Tripp | .................. H01L 31/0508 |

(Continued)

FOREIGN PATENT DOCUMENTS

| CN | 105339451 B | 7/2018 |
| CN | 110137282 A | 8/2019 |

(Continued)

OTHER PUBLICATIONS

Machine translation of JP6467549B1 (Year: 2019).*

(Continued)

*Primary Examiner* — Ryan S Cannon
(74) *Attorney, Agent, or Firm* — Frost Brown Todd LLC

(57) ABSTRACT

The present disclosure relates to large cell sheets, solar cells, shingled solar modules, and manufacturing method thereof. A top surface of a boundary portion of units of the large cell sheet is divided into a cutting area, top surface bonding areas and top surface electrically-conductive contact areas. The cutting area is configured in a way that the large cell sheet can be cut along the cutting area; the top surface bonding areas and the top surface electrically-conductive contact areas are provided alternately, the cutting area and the top surface electrically-conductive contact areas are formed as an overlapping edge of the solar cell, and after the splitting of the large cell sheet, the top surface electrically-conductive contact areas can directly contact the bottom surface of another solar cell to achieve electrically-conductive connection. The large cell sheet according to the present disclosure can be split conveniently, and the individual solar cells are provided with dedicated bonding areas and electrically-conductive contact areas. Such an arrangement can optimize the production process and use performance of the solar cells.

18 Claims, 13 Drawing Sheets

(51) Int. Cl.
    *H10F 71/00*     (2025.01)
    *H10F 71/10*     (2025.01)
    *H10F 77/166*     (2025.01)

(56) References Cited

U.S. PATENT DOCUMENTS

2018/0337299 A1    11/2018   Lee et al.
2018/0366596 A1*   12/2018   Chang ................... H01L 31/18
2022/0271190 A1*    8/2022   Jeong ............. H01L 31/022433

FOREIGN PATENT DOCUMENTS

| CN | 110473924 A | 11/2019 |
| CN | 210156385 U | 3/2020 |
| CN | 111490116 A | 8/2020 |
| EP | 3198654 B1 | 4/2021 |
| JP | 6467549 B1 * | 2/2019 |
| WO | WO 2020/052693 A2 | 3/2020 |
| WO | WO 2020/052694 A2 | 3/2020 |

OTHER PUBLICATIONS

Australian Office Action dated Sep. 15, 2023, for Application No. 2020317362, 7 pages.
International Search Report dated Jan. 6, 2021, for International Application No. PCT/CN2020/118186, 2 pages.
Supplementary European Search Report for EP 20842943.1 dated Apr. 4, 2024, 7 sheets.

\* cited by examiner

B

A-A

LARGE CELL SHEETS, SOLAR CELLS, SHINGLED SOLAR MODULE, AND MANUFACTURING METHOD THEREOF

FIELD

The present disclosure related to the energy field, and more specifically to large cell sheets, solar cells, shingled solar modules, and manufacturing method thereof.

BACKGROUND

As global fossil fuels, such as coal, oil, natural gas, and the like, are being consumed faster, the ecological environment is deteriorating continually. In particular, the greenhouse gases bring about increasingly serious global climate change, posing a grave threat to the sustainable development of human society. Countries around the world have formulated their own energy development strategies, to cope with the limited conventional fossil fuels and the environmental problems caused by development and consumption. With advantages in reliability, safety, extensiveness, longevity, environmental protection, and adequacy, solar energy has become one of the most important renewable energy resources and will be the main worldwide power supply in the future.

In the new round of energy reform, the photovoltaic industry in China has become a strategic emerging industry with international competitive advantages. However, many problems and challenges are emerging in the development of the photovoltaic industry. For example, the conversion efficiency and reliability are the greatest technical obstacles hindering the development of the photovoltaic industry, and the cost control and the scale form further economic constraints. As a core component of photovoltaic power, there is an irresistible trend to improve conversion efficiency and develop efficient assemblies. The current market is flooded with a variety of efficient assemblies, such as shingles, half pieces, multiple main grids, double-sided assemblies and the like. As the application scenarios and areas of photovoltaic solar module are increased significantly, higher requirements are imposed on its reliability. An efficient, reliable photovoltaic solar module is especially needed in some areas with a high incidence of severe or extreme weather.

In the background of promoting use of the solar energy which is a type of green energy, the shingled solar module reduces remarkably power loss based on the electrical principle of weak-current low-loss (i.e., the proportional relationship between the power loss of the photovoltaic solar module and the square of working current). Secondly, the inter-cell gap areas of the solar cell pack are fully utilized for power generation, and there is a high energy density per unit of area. In addition, an electrically conductive adhesive with elastomeric characteristics is adopted to substitute for a photovoltaic metal welding ribbon in a conventional solar module. The photovoltaic metal welding ribbon in the whole cell sheet has a high series resistance while the electrically conductive adhesive brings about a shorter current loop trip than the former. As a result, the shingled solar module stands out as the most efficient solar module. Moreover, the shingled solar module is more reliable than the conventional photovoltaic module when applied outdoors, because the shingled solar module avoids stress damage of the metal welding ribbon to the cell interconnection locations and other confluence areas. Particularly in a dynamic environment of high and low temperature alternation (as an effect of wind, snow and other nature loads), the conventional solar module with a metal welding ribbon for interconnection and packaging has a much higher failure probability than the shingled solar module in which the cut crystalline silicon cells are interconnected using an elastomeric, electrically-conductive adhesive.

Nowadays, in the mainstream technology of the shingled solar module, an electrically conductive adhesive comprised of a conductive phase and an adhesive phase is used to interconnect the cut cells. Wherein, the conductive phase is mainly formed of precious metal, such as silver particles, or particles of silver-clad copper, silver-clad nickel, silver-clad glass or the like, and plays an electrically conductive role between solar cells, and the shape and distribution of the particles are designed to attain the optimal electrical conduction. In most cases, combinations of flaky or spherical silver powder with a size of D50<10 μm are preferred at present. The adhesive phase is mainly formed of weather-resistant resin polymer, which is typically selected from acrylic resin, silicone resin, epoxy resin, polyurethane and the like, according to adhesion strength and weathering stability. In order to obtain an electrically conductive adhesive with a low contact resistance, small volume resistivity and high adhesion, and to maintain an excellent long-term weather resistance, manufacturers of electrically conductive adhesives typically formulate the conductive phase and the adhesion phase, thereby ensuring the performance stability of the shingled assemblies in the environmental erosion test at the initial term and the actual long-term outdoor application.

For a solar cell connected via electrically conductive adhesives, after being sealed, there is a problem of relative displacement between electrically conductive adhesives caused by environment erosion (e.g., thermal expansion and contraction resulting from high and low temperature alternation) when used actually outdoors. The most serious problem is current virtual connection or even open circuit caused by a weak connection between the materials after being combined. The weak connection is mainly embodied in the aspect that a process operation window is required in the process of manufacturing an electrically conductive adhesive, and the window is relatively narrow and easily inactivated under the impact of environmental factors, such as temperature and humidity of the workplace, duration of exposure in air after coating the adhesive. There may be veiled threats to the product reliability if the adhesive is applied nonuniformly or even missing somewhere due to the changes in properties of the adhesive during the dispensing, spraying or printing process. In addition, as mainly formed of polymer resin and a large amount of precious metal powder, the electrically conductive adhesive incurs high costs and destroys the ecological environment to a certain extent (e.g., manufacturing and processing of the precious metal pollute the environment). Furthermore, since the electrically conductive adhesive which is paste-like, so somehow flowable in the adhesive-applying or stacking process, overflow probably occurs, thereby causing short circuit between the positive and the negative of the shingled, interconnected solar cell string.

In other words, most of the shingled assemblies manufactured in an adhesion manner via an electrically conductive adhesive have disadvantages of weak interconnection, high requirements on the environment in the manufacturing process, short circuit resulting from overflow, high costs, low production efficiency, and the like.

Besides, to achieve the electrically-conductive connection of solar cells, usually electrodes need to be disposed on the surfaces of the solar cells. Since the electrodes are made of costly metals, the solar cells usually have high costs.

In respect of the manufacture of solar cells, there are still not large cell sheets that can form the above-mentioned solar cells and are easy for splitting operations.

Therefore, there arises a need for providing large cells, solar cells, shingled solar modules, and manufacturing method thereof, so as to at least partly solve the above problems.

SUMMARY

The objective of the present disclosure is to provide large cell sheets, solar cells, shingled solar modules, and manufacturing method thereof. The large cell sheet provided by the present disclosure can facilitate the splitting operation, and the large cell sheet is provided with an electrically-conductive contact area for realizing the electrically-conductive connection of the solar cells resulting from the splitting of the large cell sheet and a bonding area for applying an adhesive. Such an arrangement can optimize the production process and use performance of the solar cells.

Further, the solar cells formed by splitting the large cell sheet can realize electrically-conductive connection through direct contact of primary grid lines and secondary grid lines, so that the solar cells may also be fixed with an adhesive without an electrically-conductive property. This has at least the following advantages:

1. In the present disclosure, the primary grid lines are only provided on the top surface or bottom surface of the solar cell. As compared with a solution in which primary grid lines are simultaneously provided on the top surface and bottom surface of the solar cell, the present disclosure can save the amount of used silver paste and reduce costs;

2. The adhesive may be non-conductive, so the factors that easily damage the conductive adhesive, such as environmental erosion, alternating high and low temperature, thermal expansion and cold contraction, will not affect the shingled solar module of the present disclosure, and the shingled solar module is not prone to current virtual connection and circuit breaking, and there will not occur problems such as the circuit breaking of positive and negative electrodes of a cell string caused by the overflow of the conductive glue.

In accordance with one aspect of the present disclosure, there is provided a large cell sheet which is to be split to form a plurality of solar cells which can be arranged in a shingled manner to form a cell string.

Wherein, the large cell sheet comprises a base sheet, a top surface and a bottom surface of the base sheet are provided with secondary grid lines, and the top surface or bottom surface of the base sheet is provided with primary grid lines spanning all secondary grid lines, the large cell sheet is divided into a plurality of units arranged in a first direction, any two adjacent units are a first unit and a second unit, after the large cell sheet is split the first unit is formed as a first cell, and the second cell is formed as a second cell, a top surface of a boundary portion between the first unit and the second unit is divided into:
a cutting area extending in a direction perpendicular to the first direction, the cutting area being configured such that the large cell sheet can be cut along it; and
top surface bonding areas and top surface electrically-conductive contact areas which are disposed on a side of the cutting area, and alternately disposed in a direction perpendicular to the first direction, the cutting area and the top surface electrically-conductive contact areas being formed as a top surface of an overlapping edge of the second cell, wherein the top surface bonding area and the top surface electrically-conductive contact area are configured such that when the second cell is located in the cell string, an adhesive can be applied on the top surface bonding area to fix with a bottom surface of the solar cell adjacent thereto, the top surface electrically-conductive contact area can face with a corresponding area on the bottom surface of another solar cell formed by splitting the large cell sheet to achieve shingled connection of the two solar cells, and the large cell sheet is configured in a way that one of the top surface electrically-conductive contact area and the corresponding area is provided with secondary grid lines, and the other of the top surface electrically-conductive contact area and the corresponding area is provided with the primary grid lines, and the secondary grid lines and the primary grid lines directly contact to achieve electrically-conductive connection of the two solar cells.

In one embodiment, the base sheet comprises a central layer and light-transmitting electrically-conductive films formed on a top surface and a bottom surface of the central layer.

In one embodiment, the primary grid lines are disposed on a top surface of the large cell sheet, the primary grid lines comprise multiple groups with a group being disposed at an edge of each of the units, each group of primary grid lines comprises a structure with intermittently-arranged multiple segments, the segments of the primary gird lines correspond one to one with the top surface electrically-conductive contact areas.

In one embodiment, a bottom surface of the boundary portion of the first unit and the second unit is further provided with a bottom surface bonding area and a bottom surface electrically-conductive contact area, the bottom surface bonding area and the bottom surface electrically-conductive contact area are located on the other side of the cutting area in the first direction, and the bottom surface bonding area and the bottom surface electrically-conductive contact area are alternately disposed in a direction perpendicular to the first direction, and the bottom surface electrically-conductive area is formed as the corresponding area.

In one embodiment, the primary grid lines are disposed on a bottom surface of the large cell sheet, the primary grid lines comprise multiple groups with a group being disposed at an edge of each of the units, each group of primary grid lines comprises a structure with intermittently-arranged multiple segments, the segments of the primary gird lines correspond one to one with the bottom surface electrically-conductive contact areas,
and the secondary grid lines are disposed in the top surface electrically-conductive contact area of the large cell sheet.

In one embodiment, the light-emitting electrically-conductive film extends over the entire top and bottom surfaces of the central layer.

In one embodiment, the light-emitting electrically-conductive film is absent at the top surface bonding area and the bottom surface bonding area.

In one embodiment, another set of top surface bonding areas and top surface electrically-conductive contact areas are further provided on a top surface of the boundary portion between a pair of first unit and second unit at the frontmost end of the large cell sheet. Surface electrically-conductive contact areas, the another set of top surface bonding areas and top surface electrically-conductive contact areas are located on the other side of the cutting area, and the another set of top surface bonding areas and top surface electrically-conductive contact areas are formed as a top surface of an overlapping edge of the first cell sheet.

In one embodiment, the central layer comprises a silicon wafer, a top-side intrinsic amorphous silicon film disposed on a top surface of the silicon wafer, a P-type amorphous silicon film disposed on a top surface of the top-side intrinsic amorphous silicon film, a bottom-side intrinsic amorphous silicon thin film disposed on a bottom surface of the silicon wafer and an N-type amorphous silicon thin film disposed on a bottom surface of the bottom-side intrinsic amorphous silicon thin film.

In accordance with a second aspect of the present disclosure, there is provided a solar cell formed by splitting the large cell sheet according to any of the above solutions.

In one embodiment, the base sheet of the solar cell sheet comprises a central layer and a light-transmitting electrically-conductive film, the light-transmitting electrically-conductive film extends over the entire top and bottom surfaces of the central layer, and the light-transmitting electrically-conductive film extends over the entire top and bottom surfaces of the central layer, the light-transmitting electrically-conductive film has the same thickness everywhere so that when the adhesive is applied on the top surface bonding area, the adhesive protrudes from the light-transmitting electrically-conductive film, such that when the solar cell is connected with another solar cell, the light-transmitting electrically-conductive films on opposed surfaces of the two solar cells are spaced by the adhesive at the location of the adhesive.

In one embodiment, the base sheet of the solar cell comprises a central layer, and light-transmitting electrically-conductive films located on the top surface and the bottom surface of the central layer, the light-transmitting electrically-conductive film is provided with a notch at the top surface bonding area, and when the adhesive is applied on the solar cell, the adhesive is located in the notch without protruding from the light-transmitting electrically-conductive film.

In one embodiment, a top surface of an overlapping edge of the solar cell in contact with another solar cell is provided with top surface bonding areas and top surface electrically-conductive areas extending and alternately arranged along the overlapping edge, and the primary grid lines are disposed in the top surface electrically-conductive contact areas.

In one embodiment, a bottom surface of an overlapping edge of the solar cell in contact with another solar cell is provided with bottom surface bonding areas and bottom surface electrically-conductive areas extending and alternately arranged along the overlapping edge, and the primary grid lines are disposed in the bottom surface electrically-conductive contact areas.

In accordance with a third aspect of the present disclosure, there is provided a shingled solar module, comprising a cell string, wherein the cell string is formed by successively connecting a plurality of solar cells according to any of the above solutions in a shingled manner, the solar cells are fixed to one another by an adhesive, and top surfaces and the bottom surfaces of the solar cells are provided with secondary grid lines, the top surfaces or the bottom surfaces are provided with primary grid lines, the primary grid line of one of the two adjacent solar cells can directly contact the secondary grid lines of the other of the two adjacent solar cells, to achieve electrically-conductive connection between the two adjacent solar cells.

In one embodiment, the adhesive is a non-electrically-conductive adhesive.

In one embodiment, the adhesive is an adhesive having a dot-shaped structure and made of acrylic resin, silicone resin, epoxy resin or polyurethane.

In one embodiment, the adhesive is an adhesive having a dot-shaped structure and comprising a curing agent, a cross-linking agent, a coupling agent or rubber balls.

According to a fourth aspect of the present disclosure, there is provided a method for manufacturing a shingled solar module, the method comprising the following steps:
  manufacturing the large cell sheet according to any of the above solutions, the large cell sheet having secondary grid lines;
  cutting along each cutting area of the large cell sheet, so that the large cell sheet is split into a plurality of solar cells;
  connecting the plurality of solar cells in a shingled manner through an adhesive without an electrically-conductive property, so that primary grid lines of one of two adjacent solar cells directly contact secondary grid lines of the other of the two adjacent solar cells to achieve electrically-conductive connection.

In one embodiment, the method further comprises a step of applying the adhesive on the solar cell in one of the following ways: spraying, dripping, rolling, printing, and brushing.

In one embodiment, the method of manufacturing a large cell sheet does not comprise a step of providing the primary grid lines.

According to the present disclosure, it is possible to provide the large cell sheet for manufacturing solar cells, wherein a connection area of units of the large cell sheet is formed with a cutting area, top surface bonding areas and top surface electrically-conductive contact areas, and the cutting area can facilitate splitting the large cell sheet; the top surface bonding areas and the top surface electrically-conductive contact areas are formed as the overlapping edge of the solar cell, wherein a plurality of solar cell sheets formed after splitting the large cell sheet can be arranged in a shingled manner into a cell string; in the cell string, the top surface electrically-conductive contact area of one of any two adjacent solar cells can contact the other solar cell, so that the primary grid lines in one of the two solar cells can contact the secondary grid lines of the other of the two solar cells to achieve electrically-conductive connection; the adhesive for bonding adjacent solar cells together can be applied to the top surface bonding areas.

Such an arrangement can facilitate the splitting of the large cell sheet. Furthermore, the solar cells formed by splitting the large cell sheet can realize electrically-conductive connection through the direct contact of the primary grid lines and the secondary grid lines, so that the solar cells may also be fixed with an adhesive without an electrically-conductive property. This has at least the following advantages:

1. In the present disclosure, the primary grid lines are only provided on the top surface or bottom surface of the solar cell. As compared with a solution in which primary grid lines are simultaneously provided on the top surface and bottom surface of the solar cell, the present disclosure can save the amount of used silver paste and reduce costs;
  2. The adhesive may be non-conductive, so the factors that easily damage the conductive adhesive, such as environmental erosion, alternating high and low temperature, thermal expansion and cold contraction, will not affect the shingled solar module of the present disclosure, and the shingled solar module is not prone to current virtual connection and circuit breaking, and there will not occur problems such as the circuit breaking of positive and negative electrodes of a cell string caused by the overflow of the conductive glue.

BRIEF DESCRIPTION OF THE DRAWINGS

In order to better understand the above and other objectives, features and advantages of the present disclosure, preferred embodiments as shown in the accompanied drawings are provided. Throughout the drawings, the same or similar reference symbols refer to the same or similar elements. It would be appreciated by those skilled in the art that the drawings are provided to illustrate the preferred embodiments of the present disclosure, without suggesting any limitation to the scope of the present disclosure, and respective components therein are not drawn to scale.

DETAILED DESCRIPTION OF EMBODIMENTS

Reference will now be made to the drawings to describe in detail the embodiments of the present disclosure. The description here is only about preferred embodiments of the present disclosure, and those skilled in the art would envision, on the basis of the preferred embodiments described herein, other manners that can implement the present disclosure, which also fall into the scope of the present disclosure.

The present disclosure provides a large cell sheet, a solar cell, a shingled solar module and a manufacturing method thereof. The large cell sheet is used to manufacture the solar cell, such as a heterojunction solar cell, a PERC cell, and a topcon cell. Correspondingly, the solar cell provided by the present disclosure may be a heterojunction solar cell, a PERC cell or a topcon cell.

FIGS. 1 through 11 show several preferred embodiments of the large cell sheet and solar cell of the present disclosure. In the present embodiment, the large cell sheet is a large cell sheet for manufacturing the heterojunction solar cell, and the solar cell in the present embodiment is a heterojunction solar cell.

Figure 1:
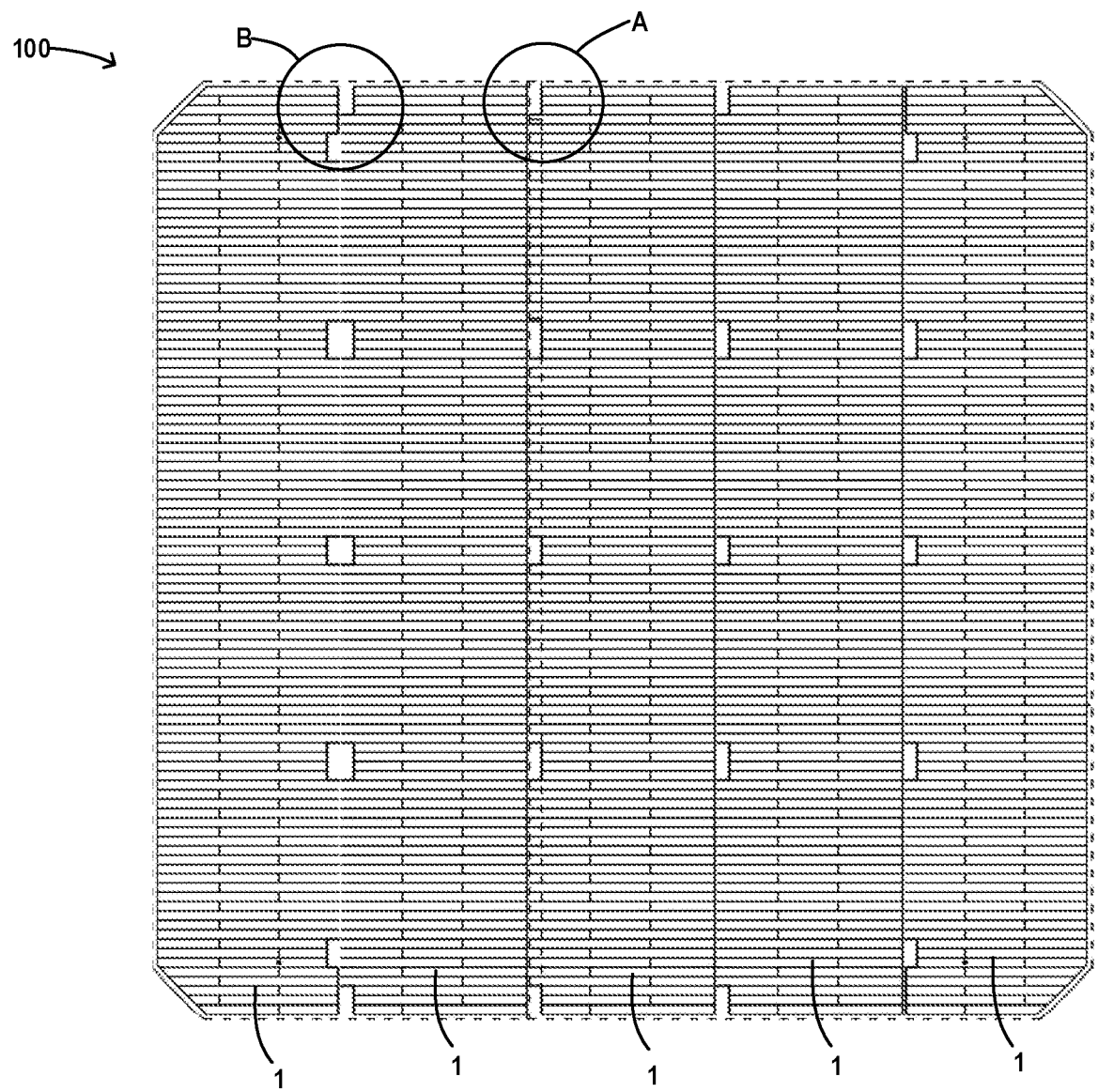
FIG. 1 shows a schematic view of a top surface of a large cell sheet according to a first embodiment of the present disclosure.

FIGS. 1-8 show a first embodiment according to the present disclosure. FIG. 1 shows a large cell sheet 100 in the present embodiment, and the large cell sheet 100 can be split to form a plurality of solar cells. The large cell sheet 100 comprises a base sheet 11, and the base sheet 11 comprises a central layer and a light-transmitting electrically-conductive film 13 disposed on a top surface and a bottom surface of the central layer. For example, the central layer further comprises a silicon wafer, a top-side intrinsic amorphous silicon film disposed on a top surface of the silicon wafer, a P-type amorphous silicon film disposed on a top surface of the top-side intrinsic amorphous silicon film, a bottom-side intrinsic amorphous silicon thin film disposed on a bottom surface of the silicon wafer and an N-type amorphous silicon thin film disposed on a bottom surface of the bottom-side intrinsic amorphous silicon thin film.

Figure 5:
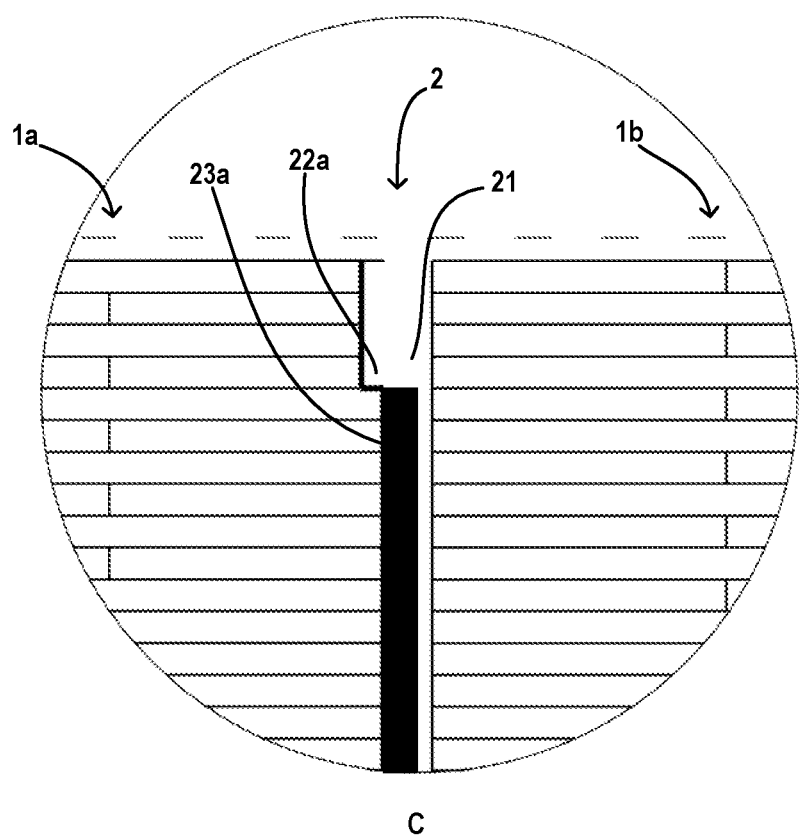
FIG. 5 is a partial enlarged view of part C in FIG. 4.

Secondary grid lines 12 are also provided on the top surface and bottom surface of the large cell sheet 100, primary grid lines spanning the auxiliary grid lines 12 are provided on the top surface or bottom surface of the large cell sheet, the large cell sheet 100 is split into two solar cells. The two solar cells can be connected in a shingled manner, wherein the conductive connection is achieved through the direct contact of the primary grid lines and the secondary grid lines 12. In the present embodiment, the primary grid lines are disposed on the bottom surface of the large cell sheet 100 (in an electrically-conductive contact area 23a on the bottom surface as shown in FIG. 5), and no primary grid lines are provided on the top surface of the large cell sheet 100.

Figure 2:
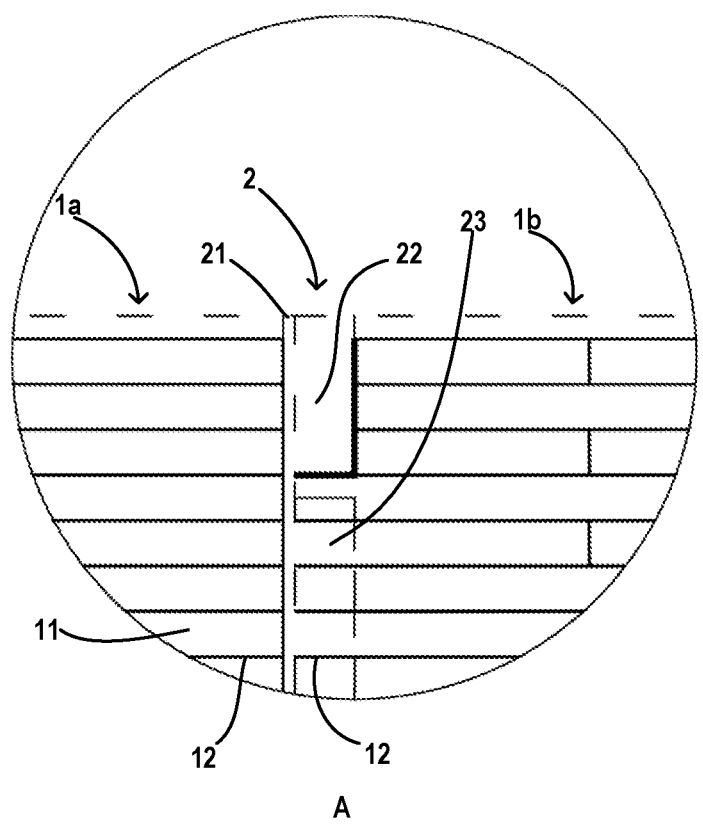
FIG. 2 is a partial enlarged view of part A in FIG. 1.

Referring to FIG. 2, the large cell sheet 100 is divided into a plurality of units 1 arranged in a straight-line direction, with any two adjacent units 1 being a first unit 1a and a second unit 1b, wherein the first unit 1a forms a first cell, and the second unit 1b forms a second cell.

Further referring to FIG. 2, a top surface of a boundary portion 2 between the first unit 1a and the second unit 1b is divided into a cutting area 21, a top surface bonding area 22 and a top surface electrically-conductive contact area 23. The cutting area 21 extends in a direction perpendicular to the arrangement direction of the solar cells, and the large cell sheet 100 can be split along the cutting area 21. After splitting, the top surface bonding area 22 and the top surface electrically-conductive contact area 23 can be formed as an overlapping edge of the second cell, and the top surface bonding area 22 and the top surface electrically-conductive contact area 23 on the large cell sheet 100 are disposed on one side of the cutting area 21 and alternately arranged in a direction parallel to the cutting area 21.

After the large cell sheet 100 is split, the second cell can be arranged in a shingled manner with another solar cell sheet (e.g., the first cell), and the bottom surface of another solar cell can directly contact the top surface electrically-conductive contact area 23 of the second cell to achieve the electrically-conductive connection. Furthermore, an adhesive 9 for fixing the two solar cells can be applied on the top surface bonding area 22.

Figure 4:
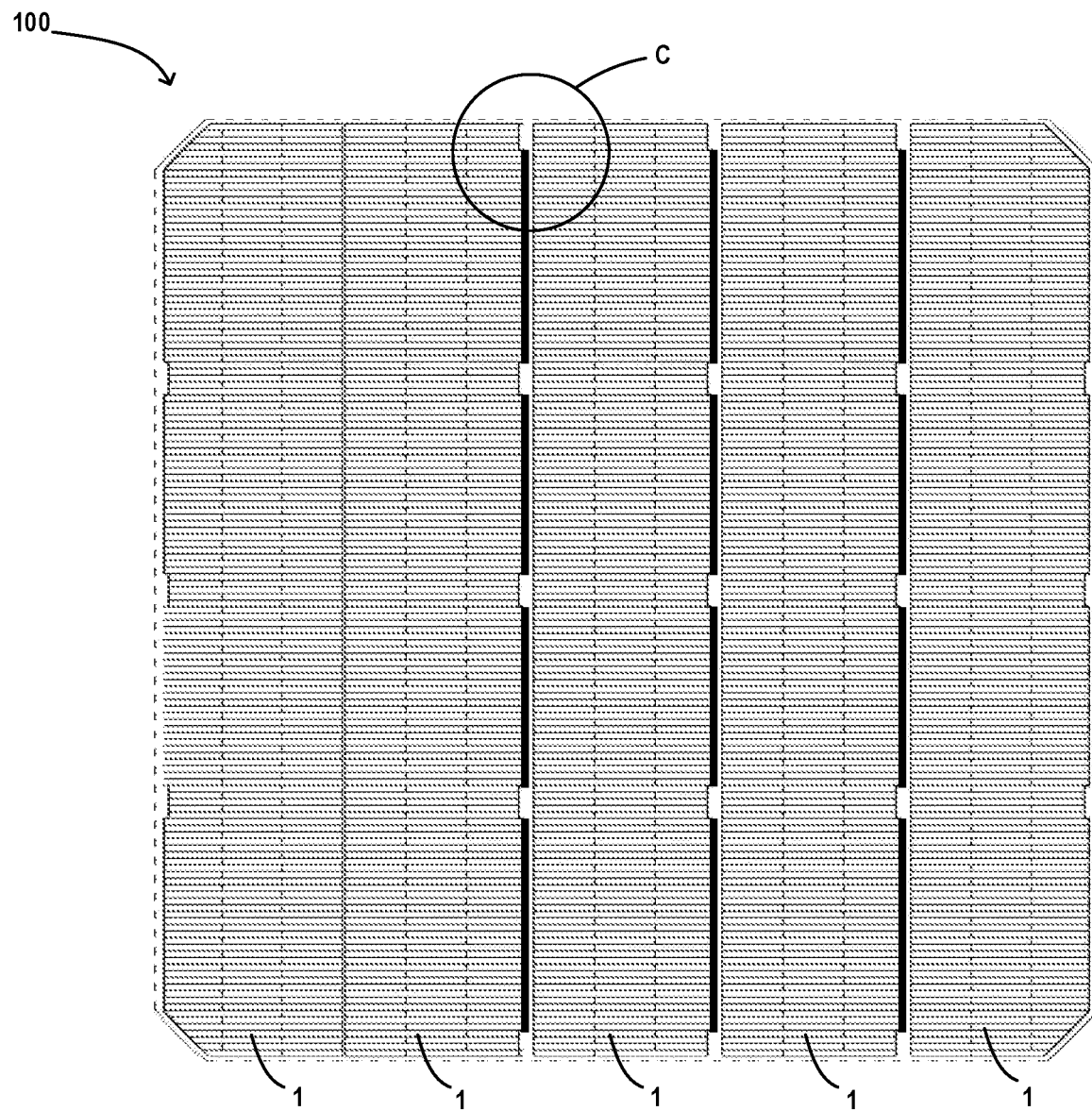
FIG. 4 is a schematic view of a bottom surface of the large cell sheet in the present embodiment.

The structure of the bottom surface of the large cell sheet 100 is shown in FIG. 4 and FIG. 5. Referring to FIG. 4 and FIG. 5, on the large cell sheet 100, the bottom surface of the boundary portion 2 of the first unit 1a and the second unit 1b is further provided with a bottom surface bonding area 22a and a bottom surface electrically-conductive contact area 23a. The bottom surface bonding area 22a and the bottom surface electrically-conductive contact area 23a are located on one side of the cutting area 21, and the bottom surface bonding area 22a and the bottom surface electrically-conductive contact area 23a are alternately arranged in a direction parallel to the cutting area 21. The bottom surface electrically conductive contact area 23a and the bottom surface bonding area 22a together constitute an overlapping edge of the first cell. The bottom surface electrically-conductive contact area 23a is provided with primary grid lines. As can be seen from the figure, the width of the primary grid line is greater than that of the secondary gate line 12.

Preferably, the primary grid lines comprise multiple groups, the groups of primary grid lines correspond one to one with the units of the large cell sheet, each group of primary grid lines further comprises a multi-segment structure, the segments of the primary gird lines correspond one to one with the bottom surface electrically-conductive contact areas 23a.

As can be seen from FIG. 2 and FIG. 5, the large cell sheet 100 is configured such that the secondary grid lines 12 are disposed on the top surface electrically-conductive contact area 23 of the overlapping edge of the top surface of the first cell formed by the first cell 1a, and the primary grid lines are disposed in the top surface electrically-conductive contact area 23a of the overlapping edge of the bottom surface. As such, when two solar cells are arranged in a shingled manner, the top surface electrically-conductive area 23 and bottom surface electrically-conductive contact area 23a of the two solar cells facing each other contact with each other. At this time, the secondary grid lines 12 in the top surface electrically-conductive contact area 23 of the solar cell on the bottom side (for example, the second cell formed by the second unit 1b) directly contact the primary grid lines of the solar cell (e.g., the first cell formed by the first cell 1a) located on the top side to thereby achieve the electrically-conductive connection.

It should be noted that the "first unit" and "second unit", "first cell" and "second cell" mentioned herein are relative rather than absolute depictions, for example, "the first unit" in a pair of adjacent units may also simultaneously be "the second unit" in another pair of adjacent units.

Figure 3:
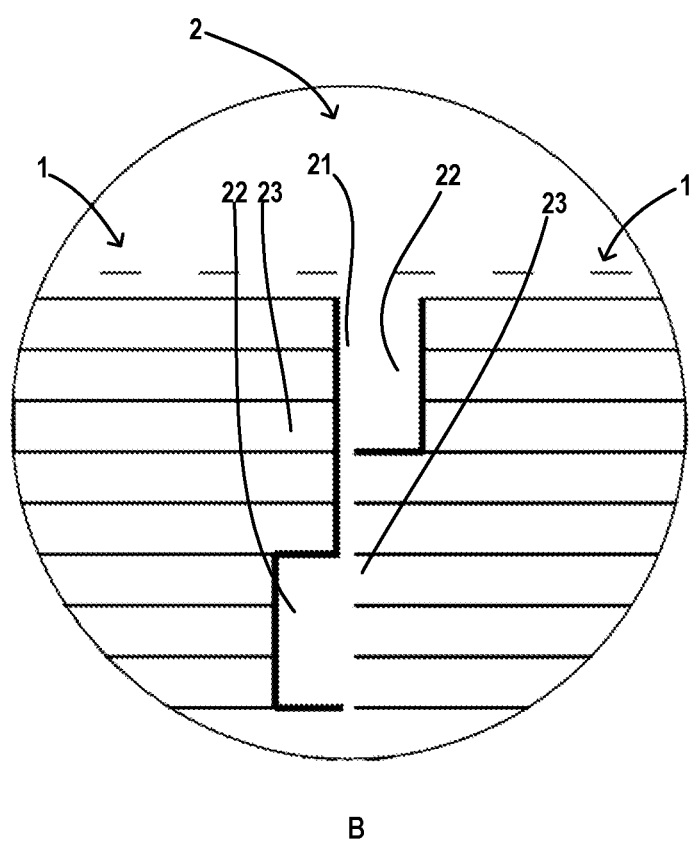
FIG. 3 is a partial enlarged view of part B in FIG. 1.

Reference is then made to FIG. 1 and FIG. 3. It can be seen that a pair of the first unit 1a and the second unit 1b at the frontmost end of the large cell sheet 100 further comprises another set of top surface bonding area 22 and top surface electrically-conductive contact area 23, that is, there is one set of top surface bonding area 22 and top surface electrically-conductive contact area 23 on each of both sides of the cutting area 21. The two sets of top surface bonding areas 22 and top surface electrically-conductive contact areas 23 are respectively formed as the top surfaces of the overlapping edges of the first cell and the second cell.

Figure 6A:
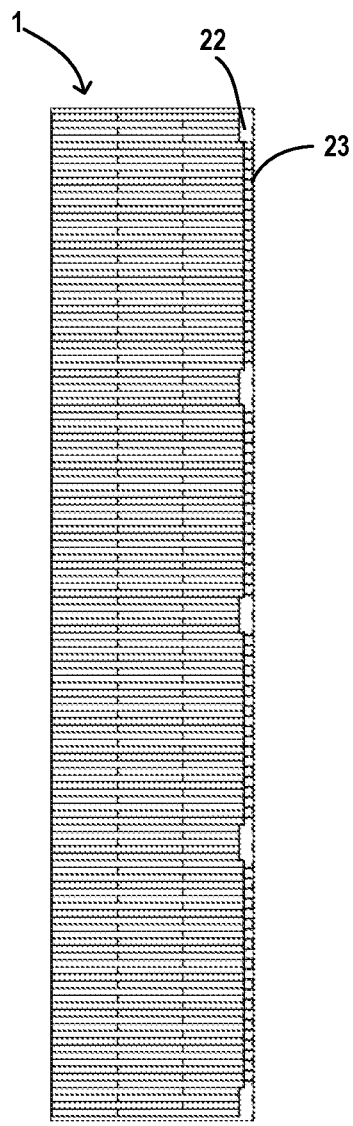
FIG. 6A and FIG. 6B are respectively a schematic view of a top surface and a schematic view of a bottom surface of a single solar cell formed by splitting the large cell sheet in FIG. 1.
Figure 6B:
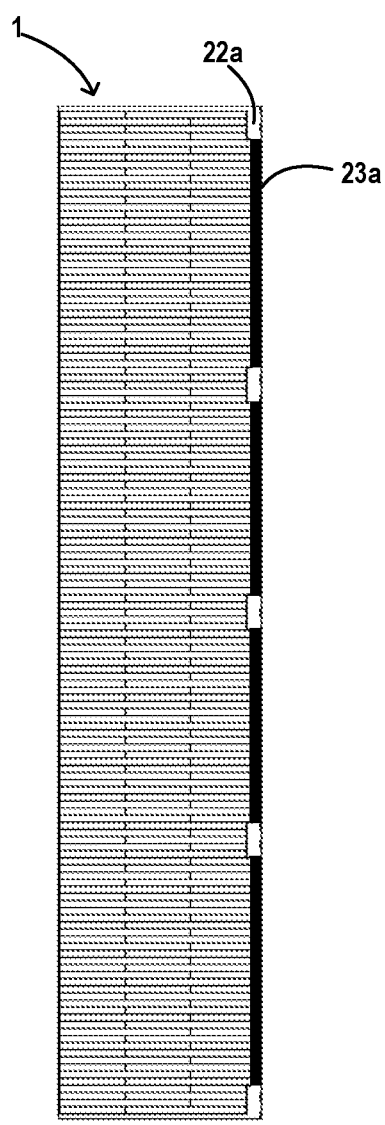

FIG. 6A and FIG. 6B show schematic views of the top surface and bottom surface of a single solar cell constituted by a single unit 1 after the large cell sheet 100 is split in the present embodiment. It can be seen that there are alternately-arranged top surface bonding areas 22 and top surface electrically-conductive contact areas 23 at the edge on the top surface of the solar cell for overlapping with another solar cell, and there are secondary grid lines and no primary grid lines in the top surface electrically-conductive contact area 23; there are alternately-arranged bottom surface bonding areas 22a and bottom surface electrically-conductive contacts 23a at the edge on the bottom surface of the solar cell for overlapping with another solar cell, and the primary grid lines are disposed in the bottom surface electrically-conductive contact area 23a.

Figure 7:
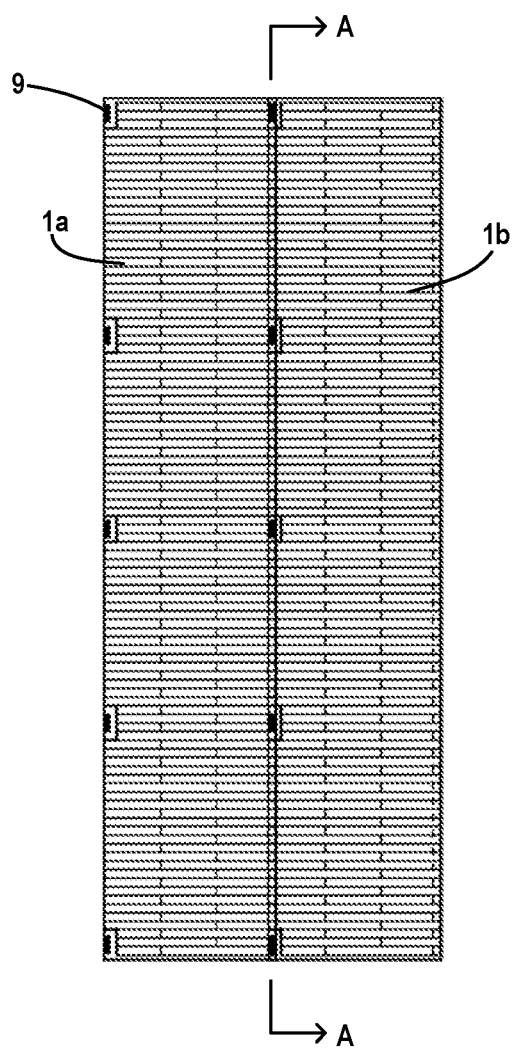
FIG. 7 is a schematic view of a top surface after two solar cells shown in FIGS. 6A-6B are arranged in a shingled manner.
Figure 8:
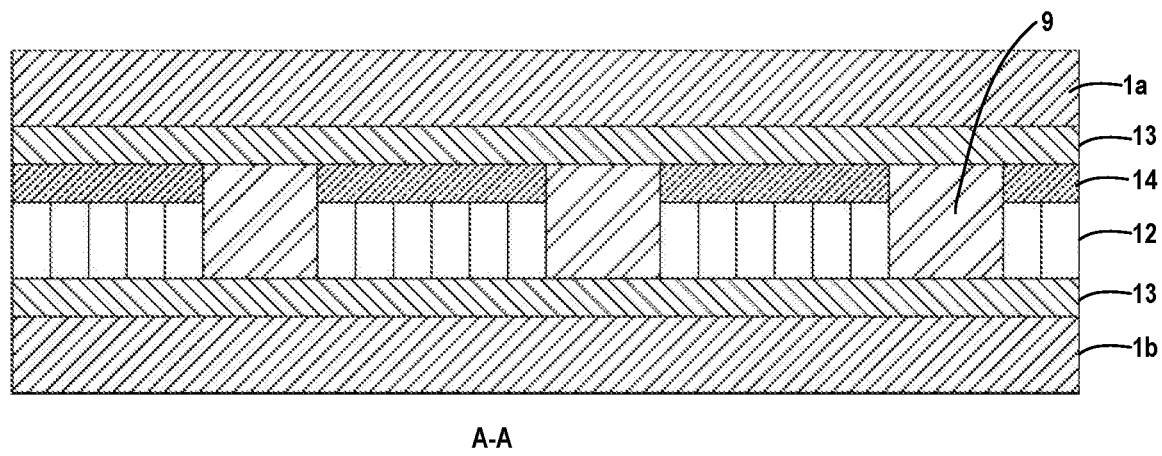
FIG. 8 is a cross-sectional view taken along line A-A in FIG. 7.

FIG. 7 and FIG. 8 show two structures after the solar cells constitute by the first unit 1a and the second unit 1b are connected in a shingled manner. It can be seen that the solar cell constituted by the first unit 1a and the second unit 1b comprises a center layer and a light-transmitting electrically-conductive film 313 disposed on a surface of the central layer.

When two solar cells are connected in a shingled manner, in an area where they are in contact with each other, the secondary grid lines 12 (located in the top surface electrically-conductive contact area 23) on the top surface of the solar cell constituted by the second unit 1b directly contact the primary grid lines 14 (located in the bottom surface electrically-conductive contact area 23a) on the bottom surface of the solar cell constituted by the first unit 1a to thereby achieve the electrically-conductive connection. Furthermore, since the primary grid lines are filled in the bottom surface electrically-conductive contact area, and the bottom surface electrically-conductive contact area is intermittently arranged in its extending direction, the primary grid lines 14 is also intermittently arranged in the cross-sectional view shown in FIG. 7, and the adhesive 9 applied on the bonding area is between the primary grid lines 14.

In the present embodiment, after the solar cells formed by splitting the large cell sheet 100 are arranged in a shingled manner, the electrically-conductive connection is achieved by the direct contact between the primary grid lines 14 and the secondary grid lines 12. Therefore, the large cell sheet 100 may reduce the amount of silver paste for forming the primary grid lines (compared to a solution in which primary grid lines are arranged on both the top surface and bottom surface). Such an arrangement can reduce costs and reduce the weight of solar cells.

FIG. 9A through FIG. 11 show a solar cell in a second embodiment according to the present disclosure. The solar cell in the present embodiment is also produced by splitting a large cell sheet (not shown). The structures of the components in the present embodiment are similar to those in the previous embodiment, and therefore the parts identical with or similar to those in the previous embodiment will not be described again.

Figure 9A:
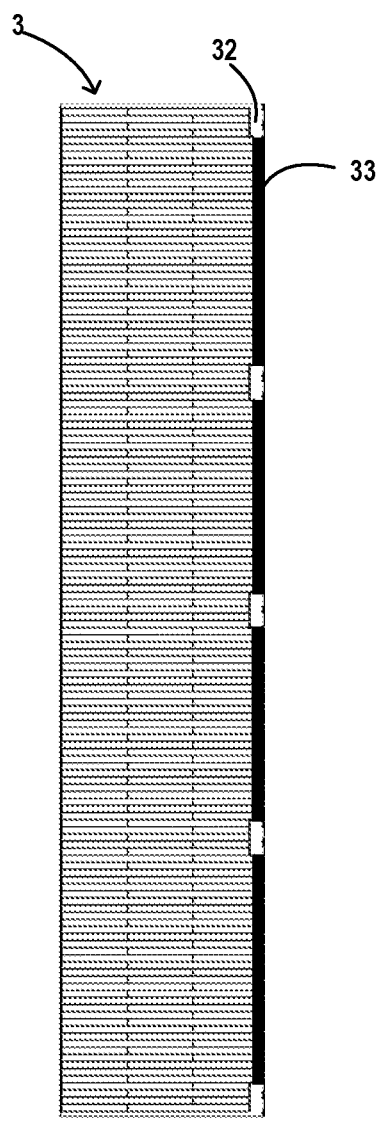
FIG. 9A and FIG. 9B are a schematic view of a top surface and a schematic view of a bottom surface of a solar cell according to a second embodiment of the present disclosure.
Figure 9B:
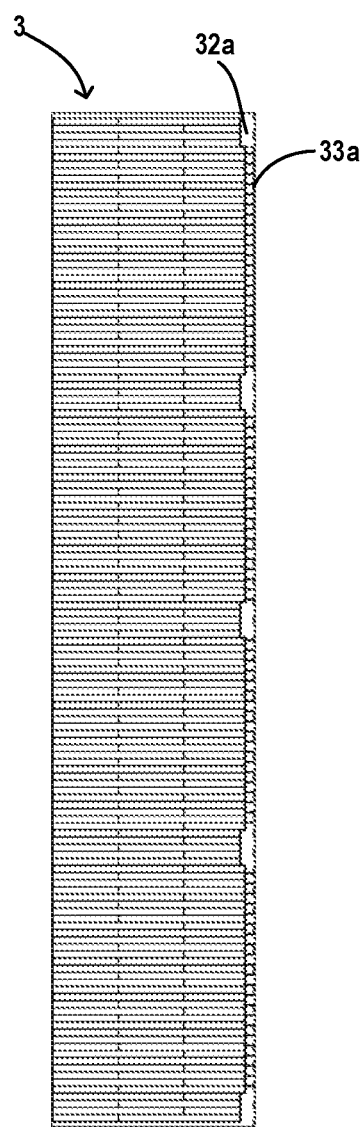

Referring to FIG. 9A, the top surface of the solar cell 3 is provided with top surface electrically-conductive contact areas 33 and top surface bonding areas 32 which extend and are alternately-arranged along the overlapping edge thereof, and primary grid line lines are formed in the top surface electrically-conductive contact area. Referring to FIG. 9B, the bottom surface of the solar cell 3 is provided with bottom surface electrically-conductive contact areas 33a and bottom surface bonding areas 32a which extend and are alternately-arranged along the overlapping edge thereof, and the secondary grid lines other than the primary grid lines are disposed in the bottom surface electrically-conductive contact area 33a.

Figure 10:
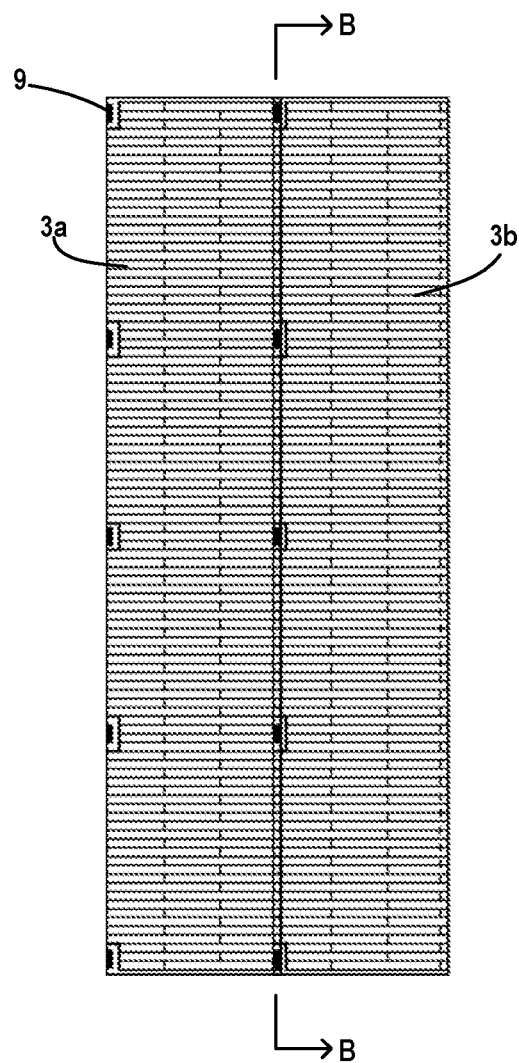
FIG. 10 is a schematic view of a top surface after two solar cells shown in FIGS. 9A-9B are arranged in a shingled manner.
Figure 11:
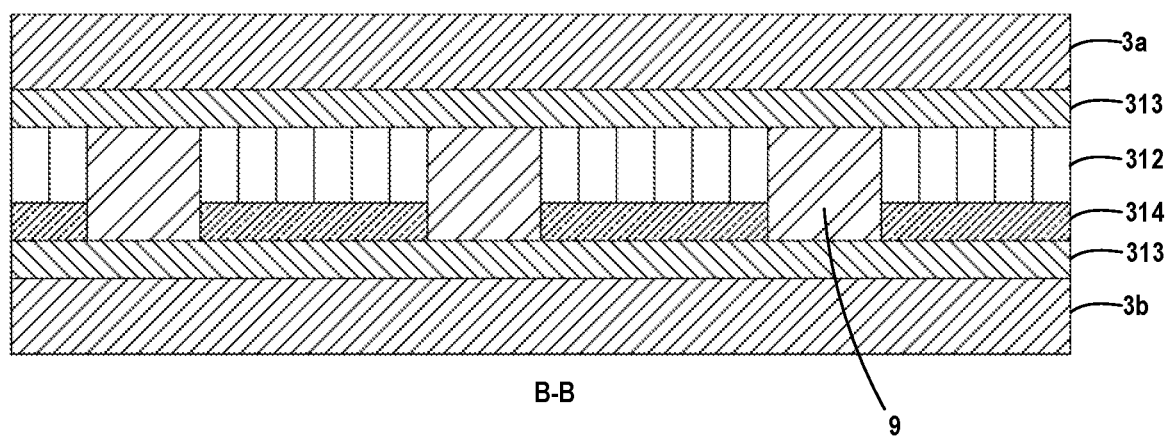
FIG. 11 is a cross-sectional view taken along line B-B in FIG. 10.

A state after two such solar cells are connected in a shingled manner is shown in FIG. 10 and FIG. 11. For the convenience of description, the two heterojunction solar cells in FIG. 10-FIG. 11 are referred to as a first cell 3a and a second cell 3b, respectively.

The first cell 3a comprises a base sheet and a light-transmitting electrically-conductive film 313 on the bottom surface of the base sheet. The bottom surface of the first cell 3a is provided with secondary grid lines 312 (specifically, in the bottom surface electrically-conductive contact area). The second cell 3b comprises a base sheet and a light-transmitting electrically-conductive film 313 on a top surface of the base sheet. The top surface of the second cell 3b is provided with primary grid lines 314 (specifically, in the top surface electrically-conductive contact area). The secondary grid lines 312 and the primary grid lines 314 directly contact to realize the electrically-conductive connection between the first cell 3a and the second cell 3b. Moreover, since the primary grid lines 314 are filled in the top surface electrically-conductive contact area, and the top surface electrically-conductive contact area is intermittently arranged in its extending direction, in the cross-sectional view shown in FIG. 11, the primary grid lines 314 are also Intermittently arranged, and the adhesive 9 applied on the bonding area is between the segments of primary grid lines 314.

In the above two embodiments, in addition to what has been described above, the respective components may also have other preferred arrangements.

For example, the adhesive may preferably employ a non-electrically-conductive adhesive. When selecting an adhesive, thoughts should be given to a variety of factors, for example to the impact on electrical connectivity, mechanical strength, and impact on product reliability, as well as to factor such as application compatibility and costs. Preferably, a liquid or non-electrically-conductive material with strong fluidity is selected to facilitate penetration into an overlapping seam between adjacent solar cells. The optional material of the adhesive may be made of for example acrylic resin, organic silicone resin, epoxy resin or polyurethane. To form a certain thickness, an auxiliary such as a curing agent, a cross-linking agent, a coupling agent or a rubber ball may also be added therein.

Since the adhesive does not have electrical conductivity, the factors that are prone to destroy the conductive adhesive, such as environmental erosion, alternating high and low temperature, thermal expansion and cold contraction, will not affect the shingled solar module and the solar cells in the present disclosure, poor current connection and circuit breaking are not easy to occur to the shingled solar module and solar cells, and the requirements for the coating accuracy of the adhesive are reduced. Furthermore, since an electrically-conductive glue is not necessarily provided, problems such as the short circuit caused by connecting of the positive and negative electrodes of the cell string caused by the overflow of the glue will not occur. In addition, the production cost of the shingled solar module is also reduced because the electrical conductivity of the adhesive is not required.

The adhesive may be provided in many forms. For example, the adhesive may be in the form of dots, and a plurality of adhesives may be intermittently arranged on the overlapping edge of each pair of adjacent two solar cells; alternatively, the adhesive may be in the shape of a strip extending along the overlapping edge of each pair of adjacent two solar cells; alternatively, the adhesive may be applied to the top surfaces of a plurality of solar cells so that the adhesive spans the plurality of solar cells; in this case, the adhesive is preferably a plurality and the plurality of adhesives are arranged parallel to one another on the top surface of the cell string; further alternatively, a plurality of adhesives may be applied on the top surface and/or bottom surface of the solar cell, and the adhesive may not be parallel to one another.

Preferably, the adhesive may also be applied on each solar cell first, and then the solar cells are interconnected with one another.

For another example, the light-transmitting electrically-conductive film may be arranged to extend over the top surface and bottom surface of the entire base sheet, and to have a uniform thickness everywhere before the solar cell are interconnected with one another. Thus, for example, for the light-transmitting electrically-conductive film on the top surface of the central layer, after the adhesive is applied on the light-transmitting electrically-conductive film at the top surface bonding area, the adhesive protrudes upwardly from the light-transmitting electrically-conductive film; for the light-transmitting electrically-conductive film on the bottom surface of the central layer, after the adhesive is applied on the light-transmitting electrically-conductive film in the bonding area of the bottom surface, the adhesive protrudes downward from the light-transmitting electrically-conductive film.

In this way, when two solar cells are interconnected in a shingled manner, the light-transmitting electrically-conductive films on the facing surfaces of the two solar cells are bent at the location of the adhesive due to the extrusion of the adhesive, so that the light-transmitting electrically-conductive films of the two solar cells are spaced at a position immediately adjacent to the adhesive. Such an arrangement is relatively simple, and no additional processing of the light-transmitting electrically conductive films is required, so the production efficiency is high and the cost is low.

As an alternative to the above solution, the light-transmitting electrically-conductive film is provided with a notch at the position where the adhesive is provided to at least partially receive the adhesive. As such, when the two solar cells are interconnected in a shingled manner, the light-transmitting electrically-conductive films of the two solar cells are in close contact, and there is no bending of the contacting surface. Such an arrangement avoids problems caused when the light-transmitting electrically-conductive films are squeezed and deformed, and the stable reception of the adhesive in the notch can avoid the occurrence of problems such as the falling off and failure of the adhesive.

Preferably, the light-transmitting electrically-conductive film on the top side and/or the bottom side of the solar cell may be a multi-layer structure, and the light transmittance of the light-transmitting electrically-conductive films progressively increases in an outwardly pointing direction perpendicular to the central layer from the central layer. Such an arrangement can improve a carrier offset rate, light transmittance and electrical conductivity of the solar cell, avoid the occurrence of problems such as low fill factor and a low circuit-breaking current, and make the solar cell have a higher photoelectric conversion rate.

The present disclosure further provides a preferred example of a method of manufacturing the above-described shingled solar module. The manufacturing method comprises the following steps: manufacturing the large cell sheet as described in the above-mentioned embodiments; cutting along each cutting area of the large cell sheet, so that the large cell sheet is split into a plurality of solar cells; connecting and bonding the plurality of solar cells in a shingled manner through an adhesive without an electrically-conductive property, so that primary grid lines of one of two adjacent solar cells directly contact secondary grid lines of the other of the two adjacent solar cells to achieve electrically-conductive connection.

Wherein, the adhesive may be applied on the light-transmitting electrically-conductive films of the solar cells first, and then the light-transmitting electrically-conductive films are connected to each other. Specifically, for two solar cells adjacent to each other (referred to as a first solar cell and a second solar cell), the step of connecting and bonding them in a shingled manner through an adhesive without the electrically-conductive property comprises sequentially the following steps: applying the adhesive on the light-transmitting electrically-conductive film in the top surface bonding area of the first solar cell; interconnecting the first solar cell with the second solar cell in a shingled manner, so that the two solar cells are fixed to each other by the adhesive.

Preferably, the method further comprises the following step between the step of applying the adhesive on the first solar cell and the step of interconnecting the first solar cell with the second solar cell: applying the adhesive on the light-transmitting electrically-conductive film of the bottom surface bonding area of the second solar cell.

Alternatively, it is also possible that the solar cells are duly arranged in the shingled manner and then the adhesive is applied thereto. Such a manner can also be implemented by several different implementation methods.

Wherein, the step of applying the adhesive may comprise: intermittently applying the adhesive along overlapping edges of each pair of adjacent solar cells, so that the adhesive is formed into a plurality of dot-shaped structures arranged at an interval along the overlapping edges.

Alternatively, the step of applying the adhesive may comprise: continuously applying the adhesive along the overlapping edges of each pair of adjacent solar cells so that the adhesive is formed into a strip-shaped structure extending along the overlapping edges.

Alternatively, the step of applying the adhesive may comprise: continuously applying the adhesive along an arrangement direction of the solar cells so that the adhesive spans the plurality of solar cells.

Preferably, the above several manners of applying the adhesive may be achieved by spraying, dripping, rolling, printing, and brushing.

Also preferably, the adhesive may also be applied by using a mesh plate, the mesh plate being provided with hollow parts. The method of applying the adhesive comprises the following steps: positioning the mesh plate on the top surface of duly-arranged solar cells, applying the adhesive on the mesh plate, so that the adhesive can be printed in desired positions through the hollow parts.

As stated above, since the central layer of the solar cell also has a multi-layer structure, the method for manufacturing a whole solar cell (large solar cell) comprises: disposing a silicon wafer; disposing a top-side intrinsic amorphous silicon thin film on a top surface of the silicon wafer; disposing a bottom-side intrinsic amorphous silicon film on a bottom surface of the silicon wafer; disposing a light-transmitting electrically-conductive film on a top surface of the top-side intrinsic amorphous silicon film and a bottom surface of the bottom-side intrinsic amorphous silicon film; disposing secondary grid lines on the light-transmitting electrically-conductive films. Preferably, the method of manufacturing a whole solar cell does not include the step of disposing primary grid lines.

The large cell sheet provided by the present disclosure can facilitate the splitting operation, and the large cell sheet is provided with the electrically-conductive contact area for the electrically-conductive connection of the solar cell and a bonding area for applying the adhesive. Such an arrangement can optimize the production process and use performance of the solar cells.

Further, the solar cells formed by splitting the large cell sheet can realize electrically-conductive connection through the direct contact of the primary grid lines and the secondary grid lines, so that the solar cells may also be fixed with an adhesive without an electrically-conductive property. This has at least the following advantages:

1. The step of providing the primary grid lines can be omitted, thereby saving silver paste and reducing costs;
2. The adhesive may be non-conductive, so the factors that easily damage the conductive adhesive, such as environmental erosion, alternating high and low temperature, thermal expansion and cold contraction, will not affect the shingled solar module of the present disclosure, and the shingled solar module is not prone to poor current connection and circuit breaking, and there will not occur problems such as the circuit breaking of the positive and negative electrodes of the cell string caused by the overflow of the conductive glue.

The foregoing description on the various embodiments of the present disclosure has been presented to those skilled in the relevant fields for purposes of illustration, but are not intended to be exhaustive or limited to a single embodiment disclosed herein. As aforementioned, many substitutions and variations will be apparent to those skilled in the art. Therefore, although some alternative embodiments have been described above, those skilled in the art can envision or develop other embodiments more easily. The present disclosure is intended to cover all substitutions, modifications and variations of the present disclosure as described herein, as well as other embodiments falling into the spirits and scope of the present disclosure.

REFERENCE SIGN

Large cell sheet 100
Unit 1
First unit 1a
Second unit 1b
First cell 3a
Second cell 3b
Boundary portion 2
Cutting area 21
Top surface bonding area 22, 32
Top surface electrically-conductive contact area 23, 33
Base sheet 11
Secondary gate line 12
Bottom surface bonding area 22a, 32a
Bottom surface electrically-conductive contact area 23a, 33a
Light-transmitting electrically-conductive film 13, 313
Adhesive 9
Primary grid line 14

We claim:

1. A large cell sheet which is to be split to form a plurality of solar cells which can be arranged in a shingled manner to form a cell string,
wherein the large cell sheet comprises a base sheet, a top surface and a bottom surface of the base sheet are provided with secondary grid lines, and the top surface or bottom surface of the base sheet is provided with primary grid lines spanning all secondary grid lines, the large cell sheet is divided into a plurality of units arranged in a first direction, any two adjacent units are a first unit and a second unit, after the large cell sheet is split the first unit is formed as a first cell, and the second unit is formed as a second cell, wherein a top surface of a boundary portion between the first unit and the second unit is divided into:
a cutting area extending in a direction perpendicular to the first direction, the cutting area being configured such that the large cell sheet can be cut along it; and
a top surface bonding area and a top surface electrically-conductive contact area which are disposed on a side of the cutting area, and alternately disposed in a direction perpendicular to the first direction, the cutting area and the top surface electrically-conductive contact area being formed as a top surface of an overlapping edge of the second cell,
wherein the top surface bonding area and the top surface electrically-conductive contact area are configured such that when the second cell is located in the cell string, a non-electrically-conductive adhesive can be applied on the top surface bonding area to bond with a bottom surface of another solar cell,
wherein the primary grid lines comprise multiple groups with a group being disposed at an edge of each of the units, each group of primary grid lines comprises a structure with intermittently-arranged multiple segments, the segments of the primary grid lines correspond one to one with the top surface electrically-conductive contact area, and
wherein, after the large cell sheet is split to form solar cells, when the second cell is arranged in a shingled manner with said another solar cell, the top surface electrically-conductive contact area of the second cell can face with a corresponding area on the bottom surface of said another solar cell formed by splitting the large cell sheet to achieve shingled connection of the two solar cells, and the large cell sheet is configured in a way that one of the top surface electrically-conductive contact area of the second cell and the corresponding area of said another solar cell is provided with primary grid lines, and when shingled, the primary grid lines on one of the top surface electrically-conductive contact area of the second cell and the corresponding area on the bottom surface of said another solar cell directly contact with secondary grid lines on the other of the top surface electrically-conductive contact area of the second cell and the corresponding area on the bottom surface of said another solar cell, to achieve electrically-conductive connection of the two solar cells.

2. The large cell sheet according to claim 1, wherein the base sheet comprises a central layer and light-transmitting electrically-conductive films formed on a top surface and a bottom surface of the central layer.

3. The large cell sheet according to claim 2, wherein the light-transmitting electrically-conductive film extends over the entire top and bottom surfaces of the central layer.

4. The large cell sheet according to claim 2, wherein the light-transmitting electrically-conductive film is absent at the top surface bonding area and the bottom surface bonding area.

5. The large cell sheet according to claim 1, wherein primary grid lines are disposed on a top surface of the large cell sheet.

6. The large cell sheet according to claim 1, wherein a bottom surface of the boundary portion of the first unit and the second unit is further provided with a bottom surface bonding area and a bottom surface electrically-conductive contact area, the bottom surface bonding area and the bottom surface electrically-conductive contact area are located on the other side of the cutting area in the first direction, and the bottom surface bonding area and the bottom surface electrically-conductive contact area are alternately disposed in a direction perpendicular to the first direction, and the bottom surface electrically-conductive area is formed as the corresponding area.

7. The large cell sheet according to claim 6, wherein the primary grid lines are disposed on the bottom surface of the large cell sheet,
and secondary grid lines are disposed in the top surface electrically-conductive contact area of the large cell sheet.

8. The large cell sheet according to claim 1, wherein another set of top surface bonding area and top surface electrically-conductive contact area are further provided on a top surface of the boundary portion between a pair of first unit and second unit at an end of the large cell sheet along the first direction, the another set of top surface bonding area and top surface electrically-conductive contact area are located on the other side of the cutting area, and the another set of top surface bonding areas and top surface electrically-conductive contact areas are formed as a top surface of an overlapping edge of the first cell.

9. The large cell sheet according to claim 1, wherein the large cell sheet comprises a central layer, the central layer comprises a silicon wafer, a top-side intrinsic amorphous silicon film disposed on a top surface of the silicon wafer, a P-type amorphous silicon film disposed on a top surface of the top-side intrinsic amorphous silicon film, a bottom-side intrinsic amorphous silicon thin film disposed on a bottom surface of the silicon wafer and an N-type amorphous silicon thin film disposed on a bottom surface of the bottom-side intrinsic amorphous silicon thin film.

10. A solar cell formed by splitting the large cell sheet according to claim 1, along the cutting area.

11. The solar cell according to claim 10, wherein the base sheet of the solar cell comprises a central layer and a light-transmitting electrically-conductive film, the light-transmitting electrically-conductive film extends over the entire top and bottom surfaces of the central layer, and the light-transmitting electrically-conductive film extends over the entire top and bottom surfaces of the central layer, the light-transmitting electrically-conductive film has the same thickness everywhere so that when the non-electrically-conductive adhesive is applied on the top surface bonding area, the adhesive protrudes from the light-transmitting electrically-conductive film, such that when the solar cell is connected with another solar cell, the light-transmitting electrically-conductive films on facing surfaces of the two solar cells are spaced by the adhesive at the location of the adhesive.

12. The solar cell according to claim 10, wherein the base sheet of the solar cell comprises a central layer, and light-transmitting electrically-conductive films located on the top surface and the bottom surface of the central layer, the light-transmitting electrically-conductive film is provided with a notch at the top surface bonding area, and when the non-electrically-conductive adhesive is applied on the solar cell, the adhesive is located in the notch without protruding from the light-transmitting electrically-conductive film.

13. The solar cell according to claim 10, wherein a top surface of an overlapping edge of the solar cell in contact with another solar cell is provided with a top surface bonding area and a top surface electrically-conductive area extending and alternately arranged along the overlapping edge, and the primary grid lines are disposed in the top surface electrically-conductive contact area.

14. The solar cell according to claim 10, wherein a bottom surface of an overlapping edge of the solar cell in contact with another solar cell is provided with a bottom surface bonding area and a bottom surface electrically-conductive area extending and alternately arranged along the overlapping edge, and the primary grid lines are disposed in the bottom surface electrically-conductive contact area.

15. A shingled solar module, comprising a cell string, wherein the cell string is formed by successively connecting a plurality of solar cells according to claim 10 in a shingled manner, the solar cells are fixed to one another by a non-electrically-conductive adhesive, and top surfaces and the bottom surfaces of the solar cells are provided with secondary grid lines, the top surfaces or the bottom surfaces are provided with primary grid lines, the primary grid line of one of the two adjacent solar cells can directly contact the secondary grid lines of the other of the two adjacent solar cells, to achieve electrically-conductive connection between the two adjacent solar cells.

16. The shingled solar module according to claim 15, wherein the adhesive is selected from the group consisting of:
 (i) an adhesive having a dot-shaped structure and made of acrylic resin, organic silicone resin, epoxy resin or polyurethane, and
 (ii) an adhesive having a dot-shaped structure and comprising a curing agent, a cross-linking agent, a coupling agent or rubber balls.

17. A method for manufacturing a shingled solar module, wherein the method comprises the following steps:
 manufacturing the large cell sheet according to claim 1, the large cell sheet having secondary grid lines;
 cutting along each cutting area of the large cell sheet, so that the large cell sheet is split into a plurality of solar cells;
 connecting and bonding the plurality of solar cells in a shingled manner through an adhesive without an electrically-conductive property, so that primary grid lines of one of two adjacent solar cells directly contact secondary grid lines of the other of the two adjacent solar cells to achieve electrically-conductive connection.

18. The manufacturing method according to claim 17, wherein the method further comprises a step of applying the adhesive on the solar cell in one of the following ways: spraying, dripping, rolling, printing, and brushing.

* * * * *